United States Patent [19]

Washizawa et al.

[11] 4,094,679

[45] June 13, 1978

[54] PROCESS FOR REDUCING HALFTONE DOT IMAGES

[75] Inventors: Yasuo Washizawa; Tomoaki Ikeda, both of Asaka, Japan

[73] Assignee: Fuji Photo Film Co., Ltd., Minami Ashigara, Japan

[21] Appl. No.: 766,282

[22] Filed: Feb. 7, 1977

[30] Foreign Application Priority Data

Feb. 16, 1976 Japan .................................. 51-16305

[51] Int. Cl.² ............................................... G03F 7/10
[52] U.S. Cl. ......................................... 96/36.3; 96/46; 156/659
[58] Field of Search ...................... 96/36.3, 46, 36.1; 156/14

[56] References Cited

U.S. PATENT DOCUMENTS

| | | | |
|---|---|---|---|
| 2,990,281 | 6/1961 | Printy et al. | 96/35.1 |
| 3,475,171 | 10/1969 | Alles | 96/35.1 |
| 3,984,582 | 10/1976 | Feder et al. | 96/35.1 |

*Primary Examiner*—John D. Welsh
*Attorney, Agent, or Firm*—Sughrue, Rothwell, Mion, Zinn and Macpeak

[57] ABSTRACT

A process for reducing the size of halftone dot images obtained by exposing and developing a metal image-forming material comprising a support, a thin metallic layer composed mainly of aluminum on the support and a photosensitive resin (or photoresist) layer on the thin metallic layer uniformly by first applying a solution capable of swelling the photosensitive resin layer to those parts which are to be subjected to dot size reduction, and then applying a reducer solution to the parts so treated.

15 Claims, No Drawings

PROCESS FOR REDUCING HALFTONE DOT IMAGES

BACKGROUND OF THE INVENTION

1. Field of the Invention

This invention relates to a process for reducing the size of halftone dot images obtained by imagewise exposing and developing a metal image-forming material comprising a support, a thin metallic layer composed mainly of aluminum on the support, and a photosensitive resin layer on the thin metallic layer.

2. Description of the Prior Art

Japanese patent application (OPI) No. 139,720/75 corresponding to U.S. patent application, Ser. No. 571,817, filed Apr. 25, 1975, now U.S. Pat. No. 4008084, discloses a metal image-forming material comprising a support, a thin metallic layer composed mainly of aluminum on the support and a photosensitive resin layer on the thin metallic layer. When this metal image-forming material is exposed through a image using active radiation and then contacted with or immersed in an alkaline solution the resin layer is dissolved or swollen at the exposed portion or unexposed portion depending on the property of the photosensitive resin layer, and the alkaline solution permeates to the metallic layer to dissolve it and thus to form the corresponding image. The image so obtained has high contrast, and superior resolving power, and is especially suitable for preparing a halftone original for printing plates.

In an ordinary silver halide photographic material for printing (a so-called lithographic material), an operation is performed to partly reduce the size of the dots forming the halftone images in order to obtain better prints. This reducing operation is usually effected by coating a reducer solution containing a compound capable of dissolving the image (silver) on a part of the image after development. This halftone dot size reduction, for example, comprises the conversion of the silver image to a silver salt and removal of the silver salt by dissolution. It is inevitable as a result for the peripheral edges of the halftone dots to be etched away and their area decreased in size, and at the same time, the density of the halftone dots as a whole to decrease.

Since, however, the halftone dot size reduction of the above-described metal image-forming material is based on a so-called "side-etching method" by which the reducer solution permeates between the support and the photosensitive resin and contacts the metal layer at sites where such does not contact the photosensitive resin or the support thereby to etch the metal layer, this method offers the great advantage that only the sizes of the area of the halftone dots is changed without decreasing the optical density of the halftone dots as a whole, which advantage cannot be obtained by a dot reduction of conventional lithographic materials.

Because the space between the support and the photosensitive resin layer is very narrow in the above-described metal image-forming material, the penetration of the reducer solution is non-uniform causing an unevenness in the etching of the metal image to occur, and the shape of the halftone dots sometimes is deteriorated. This degradation of the shape of the halftone dots, that is, the reduced similarity of the shapes of the halftone dots before and after the halftone dot size reduction, causes the serious defect to occur that prints faithful to the original cannot be obtained.

SUMMARY OF THE INVENTION

Accordingly, an object of this invention is to provide a process for halftone dot size reduction suitable for halftone images formed on the above-described metal image forming material.

Another object of this invention is to provide a process for halftone dot size reduction which ensures superior similarity of the shapes of halftone dots before and after halftone dot reduction.

According to this invention, the above objects are achieved by a process for reducing the size of halftone dot images obtained by exposing and developing a metal image forming material comprising a support, a thin metallic layer composed mainly of aluminum on the support and a photosensitive resin layer on the thin metallic layer, wherein prior to applying a reducer solution, a solution capable of swelling the photosensitive resin layer is applied to those parts which are to be subjected to halftone dot size reduction.

DETAILED DESCRIPTION OF THE INVENTION

The halftone dot reducing method of this invention can be applied to a halftone dot image formed on a metal image-forming material comprising a support, a thin metallic layer composed mainly of aluminum on the support, and a photosensitive resin layer on the thin metallic layer, particularly a metallic halftone dot image formed on the metal image-forming material described in Japanese patent application (OPI) No. 139,720/75 set forth above by the exposing and developing treatments described therein.

In the above described metal image-forming material any support can be used and suitable examples of metals which can be used in the thin metallic layer include aluminum and a metal or metals having ionization tendency less than that of aluminum such as Fe, Mn, Ga, Cr, In, Co, Ni, Pb, Sn, Sb, Bi, Cu, Ag, Pd, Au, etc. the thickness of such a metallic layer can be varied as desired and suitable conventional photosensitive resins can be employed as the layer of the photosensitive resin.

The solution capable of swelling the photosensitive resin can be selected as desired depending on the type of photosensitive resin used. Generally, the solution may be (1) an alkaline aqueous solution having a pH of at least about 9 but below about 11, (2) an organic solvent selected from the group consisting of alcohols and hydroxyethers, or (3) an alkaline aqueous solution containing an organic solvent selected from the group consisting of alcohols and hydroxyethers and having a pH of less than about 11.

Examples of preferred alkaline solutions are aqueous solutions of sodium hydroxide, potassium hydroxide, sodium phosphate, sodium carbonate, and/or sodium aluminate. These materials are merely exemplary of preferred alkaline solutions which can be used. Basically any material can be used if such can provide the aqueous solution with a pH of about 9 to 11. As described above, examples of organic solvents are alcohols, particualrly lower alcohols such as methyl alcohol and ethyl alcohol, and hydroxyethers (i.e., hydroxyalkyl alkyl ethers (hereinafter oxyethers for simplicity)) such as β-hydroxyethyl methyl ether, β-hydroxyethyl ethyl ether, β-hydroxyethyl propyl ether, β-hydroxyethyl butyl ether, etc. Alkaline aqueous solutions as described above and containing alcohols and/or oxyethers as described above can also be used and are preferred. The amount of the alcohol or oxyether in the solution in this case can be selected as desired.

Various kinds of surfactants can be added to the solution capable of swelling the photosensitive resin. Examples of suitable surfactants are those described in Japanese patent application (OPI) No. 32928/75 (corresponding to U.S. patent application Ser. No. 491,006, filed July 23, 1974, now abandoned). A suitable amount of the surfactant which can be used is up to about 3% by weight, preferably 0.005 to 1% by weight, based on the weight of the alkaline aqueous solution (1) and (3) and up to about 1% by weight, preferably up to 0.1% by weight, based on the weight of the organic solvent (2).

In the present invention, this swelling solution is applied after exposure but prior to halftone dot size reduction, preferably just prior to halftone dot reduction, to those parts of the metal image-forming material in which the size of the halftone dots is to be reduced. The method of application is not critical. When the parts to be reduced cover the entire area of the metal image-forming material, the material can be immersed in the swelling solution. Where the area of the parts to be reduced is small, the swelling solution can be dropped onto the area by squirting, using a pipette, or the like.

Suitable temperatures and times which can be used in the application of the swelling solution are about 5° to about 80° C, preferably about 15° to about 70° C for about 5 sec. to about 10 min., preferably about 20 sec. to about 7 min. in using the alkaline solution (1); about 5° to about 50° C, preferably about 15° to about 35° C for about 5 sec. to about 5 min., preferably about 10 sec. to about 3 min. in using the organic solvent (2); and about 5° to about 70° C, preferably about 15° to about 60° C for about 5 sec. to about 7 min. preferably about 15 sec. to about 5 min. in using the alkaline solution containing the organic solvent (3).

Basically, the reducer solution used in the reducing process of this invention may be selected from the various compositions used as an etchant solution for the thin metallic layer of the above-described metal image-forming material. The solution may be an alkaline or acidic soltution. However, since the halftone dot image is composed of a metal comprising mainly aluminum, the use of an acidic solution results in the formation of a stable oxide on the surface of aluminum, and etching does not proceed beyond a certain point. Hence, alkaline solutions are preferred. Preferred alkaline solutions are, for example, an aqueous solution of sodium hydroxide, and an aqueous solution of potassium hydroxide, and aqueous solution of lithium hydroxide, an aqueous solution of sodium carbonate, whose pH has been adjusted to at least about 11 e.g., up to a pH of about 13.8. Furthermore, the reducer solution used in this invention may contain a material which inhibits the formation of bubbles at the time of etching, such as sodium bromate or sodium iodate. Additional materials which can be present in the reducer solution include $NaAlO_2$, $Na_3PO_4$, etc.

In the present invention, the above-described reducer solution is applied to the metal image-forming material to which the above swelling solution has been applied. The method of application may be the same as that used in applying the swelling solution. Prior to halftone dot size reduction, the swelling solution applied to the metal image-forming material may be wiped off.

Since the reducer solution used in this invention is alkaline, it can also swell the photosensitive resin layer. But since it etches the halftone dot image simultaneously with or before the swelling of the resin layer, uniform dot size reduction cannot be expected. According to this invention, an alkaline solution or an organic solvent as described above effective only for swelling (that is, having only a slight capability of etching the halftone dot image) is applied to the metal image-forming material, so that subsequent size reduction can be performed uniformly.

The size reducing process of this invention is especially effective when a negative-type photosensitive resin is used as the photosensitive resin layer of the metal image-forming material. A negative-type photosensitive resin has strong chemical resistance at the exposed portion as compared with positive-type photosensitive resins, and is not easily swollen with solvents used for ordinary processing solutions, such as water. Thus, the application of a swelling agent prior to halftone dot size reduction is effective as in the process of this invention. Examples of the negative-type photosensitive resins are those described in Japanese patent application (OPI) No. 139,720/75 (page 5, left bottom column, line 1 to page 6, line 13), and blends of such resins with chlorinated polyolefins, e.g., chlorinated polyethylene, chlorinated polypropylene, a mixture of chlorinated polyethylene and chlorinated polypropylene, etc.

The size reducing process of this invention is further effective for a halftone dot size reducing operation which is performed after a lapse of some time e.g., about 3 hours, from the exposure and developing treatment of the above-described metal image-forming material. The size reducing process of this invention is useful because in general printing techniques, halftone dot size reduction is rarely performed immediately after the development.

According to the size reducing process of this invention, the similarity of the shapes of halftone dots after the size reduction to that before the size reduction is high, and only the sizes of the halftone dots are changed without changing the density of the halftone dots. Hence, prints of superior quality can be obtained.

The following examples are given to illustrate the present invention in greater detail. Unless otherwise indicated herein, the parts, percentages, ratios and the like are by weight.

EXAMPLE 1

About 400 mg of an Al-Fe (5:1 atomic ratio) alloy was placed in a tungsten boat disposed in a vacuum-deposition apparatus, and a 100 μm-thick polyethylene terephthalate film was placed within the vacuum deposition chamber at a distance of about 30 cm from the evaporation source. Under a vacuum of about $5 \times 10^{-5}$ torr, an aluminum/iron alloy vacuum-deposited film having a thickness of about 600 Å was obtained. A photosensitive resin composition having the following formulation was coated on the vacuum-deposited alloy layer to a dry thickness of about 1.5 μm by means of a whirler, and dried in a dryer at 100° C for 2 minutes.

| Formulation of the Photosensitive Resin Composition | | |
|---|---|---|
| Copolymer of Methyl Methacrylate and Methacrylic Acid (7:3 molar ratio) | 1 | g |
| Pentaerythritol Tetraacrylate | 0.85 | g |
| N-Methyl-2-benzoyl Methylene-β-naphthothiazole | 60 | mg |
| Methyl Ethyl Ketone | 12 | g |

-continued

| Formulation of the Photosensitive Resin Composition | |
|---|---|
| Methyl Cellosolve Acetate | 12 g |

The photosensitive material so obtained was exposed through a halftone original for 40 seconds at a distance of 1 m using a Fuji PS Light (a 2KW metal halide lamp produced by the Fuji Photo Film Co., Ltd.), and then immersed in a developing and etching solution of the following formulation.

| Formulation of Developing and Etching Solution | |
|---|---|
| NaOH | 4 g |
| KBrO$_3$ | 10 g |
| Water | 1 liter |

After an immersion time of about 18 seconds at a solution temperature of 26° C, the metal layer at the unexposed portion was removed. The photosensitive material so treated was allowed to stand overnight, and subjected to halftone size reduction using a reducer solution of the following formulation at about 25° C for 1 minute.

| Formulation of Reducer Solution | |
|---|---|
| NaOH | 2 g |
| KBrO$_3$ | 6 g |
| Water | 100 ml |

At this time, the etching of the metal was non-uniform, and the shape of the halftone dots was impaired.

The other parts of the same photosensitive material were immersed in a swelling solution of the following formulation at about 25° C for about 1 minute.

| Formulation of Swelling Solution | |
|---|---|
| Na$_3$PO$_4$ · 12 H$_2$O | 5 g |
| Water | 100 ml |

The surface of the photosensitive material was wiped off with a filter paper, and the material was subjected to halftone dot size reduction using the above reducer solution at about 25° C for 1 minute. At this time, the metal was uniformly etched, and the shapes of the halftone dots before and after reduction were similar to each other.

EXAMPLE 2

A halftone dot image prepared in the same way as in Example 1 was allowed to stand overnight, and then immersed in a solution of the following formulation at about 25° C for about 1 minute, and then subjected to halftone dot size reduction using the same reducer solution as used in Example 1.

| Formulation of Swelling Solution | |
|---|---|
| Na$_2$CO$_3$ | 5 g |
| Water | 100 ml |

The metal layer was etched uniformly, and the similarity of the shapes of the halftone dots before and after the size reduction was superior.

EXAMPLE 3

The same procedure as in Example 2 was repeated except that the photosensitive material was immersed in a solution of the following formulation at about 25° C for 1 minute prior to halftone dot size reduction.

| Formulation of Swelling Solution | |
|---|---|
| NaOH | 0.4 g |
| Water | 100 ml |

Satisfactory halftone dot size reduction could be performed.

EXAMPLE 4

When the same procedure as in Example 2 was performed except that the photosensitive material was immersed in ethanol at about 20° C for about 30 seconds prior to halftone dot size reduction, satisfactory halftone dot size reduction could be performed.

While the invention has been described in detail and with reference to specific embodiments thereof, it will be apparent to one skilled in the art that various changes and modifications can be made therein without departing from the spirit and scope thereof.

What is claimed is:

1. A process for reducing the size of the dots of a halftone dot image comprising:
   (1) imagewise exposing, using active radiation, a metal image-forming material comprising (a) a support, (b) a thin metallic layer comprised mainly of aluminum on said support, which thin metallic layer is dissolved in the alkaline developer solution of step (2), and (c) a photosensitive resin layer on said thin metallic layer, which photosensitive resin layer is dissolved or swollen and selectively removed at exposed or unexposed areas by contact with the alkaline developer solution of step (2);
   (2) developing said image-wise exposed metal image-forming material with an alkaline developer solution to cause the dissolving of the thin metallic layer and the dissolving or swelling and selective removal of the photosensitive resin layer, a halftone dot image resulting upon development of the photosensitive resin layer;
   (3) applying a solution which is effective only to swell the photosensitive resin layer but which at most has only a slight capability to etch the halftone dot image at those parts of said metal image-forming material in which the size of the halftone dots is to be reduced, thereby swelling the photosensitive resin; and then
   (4) applying to said metal image-forming material a reducing solution which reduces the size of said dots comprising the half-tone image, the reducing solution permeating between the support and the photosensitive resin layer to contact the thin metallic layer at sites where the thin metallic layer does not contact the photosensitive resin layer or the support and etching the thin metallic layer.

2. The process of claim 1, wherein the solution effective only to swell the photosensitive resin layer is an alkaline aqueous solution having a pH of at least about 9 but below about 11, an organic solvent selected from the group consisting of alcohols and hydroxyethers, or an alkaline aqueous solution with a pH of less than about 11 containing an organic solvent selected from the group consisting of alcohols and hydroxyethers.

3. The process of claim 2, wherein the alkaline aqueous solution is an aqueous solution of sodium hydroxide, potassium hydroxide, sodium phosphate, sodium carbonate, sodium aluminate or a mixture thereof.

4. The process of claim 2, wherein the organic solvent selected from the group consisting of alcohols and hydroxy ethers is used.

5. The process of claim 1, wherein the solution effective only to swell the photosensitive resin layer further contains a surface active agent.

6. The process of claim 1, wherein the reducing solution is an alkaline aqueous solution having a pH of at least about 11.

7. The process of claim 6, wherein the alkaline aqueous solution is an aqueous solution of sodium hydroxide or potassium hydroxide.

8. The process of claim 4, wherein said alcohol is methyl alcohol or ethyl alcohol.

9. The process of claim 4, wherein said hydroxyether is β-hydroxyethyl methyl ether, β-hydroxyethyl ethyl ether, β-hydroxyethyl propyl ether or β-hydroxyethyl butyl ether.

10. The process of claim 1, wherein the photosensitive resin layer is dissolved or swollen to be selectively removed at the unexposed areas by contact with said alkaline developer solution.

11. The process of claim 1, wherein the thin metallic layer composed of mainly aluminium includes aluminium and a member selected from the group consisting of Fe, Mn, Ga, Cr, In, Co, Ni, Pb, Sn, Sb, Bi, Cu, Ag, Pd or Au.

12. The process of claim 1, wherein the photosensitive resin layer is dissolved or swollen to be selectively removed at the exposed areas by contact with said alkaline developer solution.

13. The process of claim 10, wherein said photosensitive resin layer contains an addition polymerizable compound having at least one ethylenically unsaturated double bond, a photopolymerization initiator and a binder polymer.

14. The process of claim 2, wherein said reducing solution is a alkaline aqueous solution having a pH of at least about 11.

15. The process of claim 14, wherein said photosensitive resin layer contains an addition polymerizable compound having at least one ethylenically unsaturated double bond, a photopolymerization initiator and a binder polymer.

* * * * *